US008669122B2

(12) United States Patent
Viala et al.

(10) Patent No.: US 8,669,122 B2
(45) Date of Patent: Mar. 11, 2014

(54) METHOD FOR PRODUCING A MAGNETIC TUNNEL JUNCTION AND MAGNETIC TUNNEL JUNCTION THUS OBTAINED

(75) Inventors: Bernard Viala, Sassenage (FR); Marie-Claire Cyrille, Sinard (FR); Bernard Dieny, Lans en Vercors (FR); Kévin Garello, Locmaria-Plouzane (FR); Olivier Redon, Seyssinet Pariset (FR)

(73) Assignees: Commissariat a l'Energie Atomique et aux Energies Alternatives, Paris (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 13/112,050

(22) Filed: May 20, 2011

(65) Prior Publication Data

US 2011/0266642 A1 Nov. 3, 2011

Related U.S. Application Data

(63) Continuation of application No. PCT/FR2009/052277, filed on Nov. 24, 2009.

(30) Foreign Application Priority Data

Dec. 11, 2008 (FR) .................................. 08 58469

(51) Int. Cl.
*H01L 21/20* (2006.01)

(52) U.S. Cl.
USPC ............... 438/3; 438/168; 257/421; 257/315; 257/E21.09; 365/117; 365/145

(58) Field of Classification Search
USPC ......... 257/421, 315, E29.323, E21.09; 438/3, 438/168; 365/117, 145, 157, 158
See application file for complete search history.

(56) References Cited

U.S. PATENT DOCUMENTS

| 5,698,286 | A | * | 12/1997 | Ikarashi et al. | ............ 428/840.3 |
| 6,054,226 | A | * | 4/2000 | Takeda et al. | ................. 428/682 |
| 7,230,265 | B2 | * | 6/2007 | Kaiser et al. | ..................... 257/30 |
| 7,252,852 | B1 | * | 8/2007 | Parkin | ........................... 427/131 |
| 7,598,555 | B1 | * | 10/2009 | Papworth Parkin | .......... 257/295 |
| 7,906,231 | B2 | * | 3/2011 | Parkin | ........................... 428/811 |
| 2002/0030945 | A1 | * | 3/2002 | Odagawa et al. | ............. 360/313 |
| 2003/0062553 | A1 | * | 4/2003 | Ramesh et al. | ............... 257/295 |

(Continued)

FOREIGN PATENT DOCUMENTS

JP 01-172559 A1 7/1989

OTHER PUBLICATIONS

Kaan Oguz et al., "*Room-Temperature Magnetoresistance in CoFeB/STO/CoFeB Magnetic Tunnel Junctions*," Journal of Magnetism and Magnetic Materials, vol. 321, No. 8, 2 May 2008, pp. 1009-1011.

(Continued)

*Primary Examiner* — Thinh T Nguyen
(74) *Attorney, Agent, or Firm* — Burr & Brown, PLLC

(57) ABSTRACT

According to this method for producing a magnetic tunnel junction, a film of a dielectric material capable of acting as a tunnel barrier is deposited between two nanocrystalline or amorphous magnetic films. The dielectric material constituting the tunnel barrier consists of an at least partially crystalline perovskite, and said material is deposited by ion beam sputtering in a vacuum chamber.

8 Claims, 1 Drawing Sheet

(56) References Cited

U.S. PATENT DOCUMENTS

2005/0104101 A1* 5/2005 Sun et al. .................. 257/295
2005/0152075 A1   7/2005 Miyazawa et al.
2006/0255383 A1* 11/2006 Kaiser et al. ............... 257/295
2009/0091863 A1* 4/2009 Hosotani et al. ........... 360/324.2

OTHER PUBLICATIONS

Emmanuel Defay, et al., "*High Pass Filter with Above IC Integrated $SrTiO_3$ High K MIM Capacitors*," Solid State Electronics, Elsevier Science Publishers, Barking, GB, vol. 51, No. 11-12, Nov. 14, 2007, pp. 1624-1628.

J. Bass, et al., "*Current-Perpendicular (CPP) Magnetoresistance in Magnetic Metallic Multilayers*," Journal of Magnetism and Magnetic Materials, vol. 200, 1999, pp. 274-289.

K. Nagasaka, et al., "*Giant Magnetoresistance Properties of Specular Spin Valve Films in a Current Perpendicular to Plane Structure*," Journal of Applied Physics, vol. 89, No. 11, Jun. 1, 2001, pp. 6943-6945.

\* cited by examiner

METHOD FOR PRODUCING A MAGNETIC TUNNEL JUNCTION AND MAGNETIC TUNNEL JUNCTION THUS OBTAINED

FIELD OF THE INVENTION

This invention relates to the field of magnetic elements with magnetic tunnel junction with so-called "tunnel magneto-resistance" response.

It can be used particularly in radio-frequency oscillators and in the read heads of hard disks. It also relates to non-volatile magnetic random access memories, used in a known way for storing, reading and writing data in electronic systems.

BACKGROUND OF THE INVENTION

In the field of ultra-high density magnetic recording, the magnetic field sensors used since 1992 in the read heads of computer hard disks are based on magneto-resistive materials which allow variations in magnetic field at the surface of the magnetic media to be converted into voltage variation at the terminals of the magneto-resistive sensor. So that there is good impedance matching with the pre-amplifier which pre-amplifies the sensor signal prior to the signal processing chain, research is being conducted into producing sensors which have impedance of the order of a few tens of Ohms (and typically 30 $\Omega$). Given the decreasing size of the sensor related to the increase in the storage density, this pre-supposes working with materials which have Resistance-Area (RA) products typically of between 0.1 $\Omega \cdot \mu m^2$ and a few $\Omega \cdot \mu m^2$.

A plurality of magneto-resistive materials has been envisaged:

1) entirely metal multi-layers with giant magneto-resistance (see for example: J. Bass and W. Pratt, *Journ. Magn. Magn. Mater*. 200 (1999) 274). These offer resistance levels that are for the moment too low, typically of the order of between 1 and a few tens of $m\Omega \cdot \mu m^2$;
2) To increase the RA product, a proposal has been made to introduce into the separating film a discontinuous oxide film the effect of which is to locally confine the current lines (an approach termed "current confined path", or CCP) (Nagasaka, K et al, *Journ. Appl. Phys.*, 89, 6943 (2001)). However, this approach raises reliability problems with the magneto-resistive sensor. Indeed, current densities through the pinholes of the discontinuous oxide film are considerable (and typically $10^9$ to $10^{11}$ A/cm$^2$). This leads to excessive electro-migration phenomena which may affect the lifespan of the sensors (presumed to be >10 years).
3) Huge progress has been made over recent years in respect of magneto-resistive tunnel junctions with the result that RA products can now be obtained that are sufficiently low with simultaneously a sufficient magneto-resistance amplitude. These junctions are produced either alumina based (typically RA~1 to 5 $\Omega \cdot \mu m^2$ with TMR between 10 and 30%), or MgO based (typically RA~7 to 50 $\Omega \cdot \mu m^2$, TMR~50 to 150%), or TiOx based (typically RA~0.3 to 2 $\Omega 10\ \mu m^2$, TMR~10 to 20%). However, the lateral dimension of the sensor is getting ever smaller and this characteristic RA product needs to be reduced further in order to be able to preserve a sensor resistance in the right range. But the usual materials AlOx, MgO do not allow the RA product to be lowered sufficiently (tunnel barrier height too high as explained below). New materials are therefore required for the tunnel barrier with a lower barrier height.

This same need for materials with a low barrier height exists in the context of spin-transfer radio-frequency oscillators. These oscillators include magnetic tunnel junctions wherein magnetization excitations are generated that are maintained by using the so-called "spin transfer" phenomenon. These excitations typically appear at current densities (J) above a few $10^7$ A/cm$^2$. M the tunnel junctions are voltage-limited as a result of electrical breakdown phenomena (typically to ~0.5 volt), it will be understood that this sets a limitation on the maximum value of the RA product at a few $\Omega \cdot \mu m^2$ since V=RA·J (Ohm's Law). These values are difficult to reach in a reliable and reproducible way and without significant loss of tunnel magneto-resistance amplitude with materials like AlOx or MgO. Here too, it is felt there is a need to have materials available for the tunnel barriers that have a lower barrier height, and therefore a better transparency for the tunnel electrons.

There is renewed interest being shown in MRAM (*Magnetic Random Access Memories*) due to the fact that magnetic tunnel junctions are being perfected that have a strong magneto-resistance at room temperature. These magnetic tunnel junctions comprise a stack of a plurality of alternately magnetic and non-magnetic films.

Preferentially, the two magnetic films located on either side of the non-magnetic film acting as a tunnel barrier, are produced based on 3d metals (Fe, Co, Ni) and alloys thereof. These films are also capable of being doped with boron or zirconium, in order to render the structure of said films amorphous and to level the interface thereof.

The tunnel barrier is an insulating or semi-conducting film, and therefore separates the two aforementioned magnetic films. It more often than not comprises amorphous alumina (AlO$_x$) or crystalline magnesium oxide (MgO).

In the context of magnetic memories, the two magnetic films located on either side of the tunnel barrier are in the locked state and free state, respectively.

"Locked" is taken to mean that the orientation of the magnetization of said film is fixed even though the orientation of the magnetization of the so-called "free" film is capable of varying under the effect of an external magnetic field for example, the respective orientation of the magnetizations of the free and locked films defining the state of the resulting memory.

In order to lock the so-called "locked" magnetic film, there is a known technique of coupling same to an additional magnetic film produced in an antiferromagnetic material, such as for example one produced on the basis of manganese alloy, and more specifically PtMn, PdPtMn, NiMn, IrMn or FeMn.

If in terms of the physical principle, the operation of these magnetic tunnel junctions has been demonstrated, there is on the other hand a difficulty with industrialisation to be overcome. Indeed, research is being conducted now on combining for the magnetic tunnel junctions employed, whatever use they are put to (magnetic memory, oscillator or read head), a high value of the magneto-resistance, defined by the TMR magnitude (ratio of the tunnel magneto-resistance between the parallel and anti-parallel configurations of the magnetizations of the so-called free and locked films), which are therefore required to be above 200%, and a low value of the RA product, and typically below 1 $\Omega \cdot \mu m^2$.

There is a plurality of reasons why this combination is significant:

in the field of mass storage on hard disk, increasing the storage density requires a reduction in the size of the read head in order to read the ever finer information written on the disk. As far as the tunnel junctions are concerned, this translates into an increase in their resistance if their RA product is not adapted. To maintain constant head impedance around 50$\Omega$, it is therefore necessary to gradually reduce the RA product. For densities of the Tb/in$^2$ and beyond, the necessary RA products must be <<1 $\Omega\cdot\mu m^2$. In parallel, it is desirable for the read signal not to be degraded, and therefore for the TMR to remain high. But it is known to those skilled in the art that if the thickness of the tunnel barrier is reduced below 0.8 nanometres, the uniformity if not the continuity of the barrier is no longer guaranteed, which causes a rapid drop in the TMR.

in the memory field, it is the write mode that requires the RA product to be reduced to extremely low values. Indeed MRAMs such as STT-RAM (Spin Transfer Torque Magnetic Random Access Memory) are written simply by causing a high density spin polarized current to flow through the tunnel junction. When the current density exceeds a threshold value (~$10^7$ A/cm2), the reversal of the magnetization of the free film can be observed, and without any assistance from a magnetic field. To avoid a breakdown of the tunnel barrier, it is desirable for its RA product to be significantly reduced, generally below 5 $\Omega\cdot\mu m^2$. The more quickly it is required to write, the more the current density increases. It is therefore considered necessary to drop below 1 $\Omega\cdot\mu m2$. As for the read heads, the memory output signal is directly proportionate to its TMR. It is therefore appropriate to keep it at a high level while reducing the RA product.

Prior art magnetic tunnel junctions in fact have a great many limitations.

First of all, for magnetic tunnel junctions with MgO barrier of low RA product, i.e. close to 0.5 $\Omega\cdot m^2$, the value of the TMR is relatively small, and typically close to 50% because of the inhomogeneity effects of the barrier thickness, which reduces the read (voltage) signal and creates hot points in the tunnel barrier (zone of highest current density), increasing the risks of electrical breakdown of the tunnel junction.

Furthermore, the height of such tunnel barriers is significant, and typically close to 7.5 eV, so that very low RA products cannot in this way be attained, while guaranteeing good reliability (risk of breakdown given the very small degree of barrier thickness required).

What is more, complex oxidation methods are encountered in producing the tunnel barrier since more often than not the starting point is a pure magnesium target.

In order to overcome these difficulties, a proposal has been made to replace the tunnel barrier, more often than not made of crystalline MgO, by polycrystalline strontium titanate (SrTiO$_3$).

Theoretically speaking, the use of such a material as tunnel barrier leads to the following advantages:
  high TMR (above 300%);
  low RA product<<1 $\Omega\cdot\mu m^2$;
  reduced barrier height (<4.5 eV);
  simplified development method (starting from SrTi oxide and not metal).

However, given the crystallization temperature of the strontium titanate, it has not hitherto been possible to develop such magnetic tunnel junctions. Indeed; this crystallization temperature remains very high, above 500° C., and therefore not compatible with the materials employed for the magnetic electrodes located on either side of the tunnel barrier.

Indeed, a crystalline SrTiO$_3$ barrier is traditionally made by physical vapour deposition (PVD) such as cathode sputtering for example or by laser ablation and generally requires elaboration (deposition or annealing) temperatures typically of between 550 and 800° C., which is consequently incompatible with the magnetic films constituting the stack.

BRIEF DESCRIPTION OF THE INVENTION

This invention relates to a method for producing magnetic tunnel junctions that is able to overcome these drawbacks.

It is based on the production of said magnetic tunnel junctions employing a tunnel barrier in an at least partially crystalline (and for example polycrystalline) perovskite material and conventional conducting magnetic electrodes via a physical deposition technique, comprising in the case in point Ion Beam Sputtering (IBS). This technology, which belongs to the so-called sputtering methods, comprises producing ions that come from a source and are accelerated towards the material for sputtering. The bombardment produced by these ions on the target material creates a metallic vapour which is then deposited and condensed on the substrate or on a film already deposited to form a thin film, and typically of nanometric thickness so as to bring about the desired physical effects.

In this way, this method for producing, in particular the tunnel barrier made of strontium titanate, leads to the deposition of an amorphous barrier of said kind, with the crystallization temperature thereof being reduced relative to that used in the prior art, typically below 400° C., and can therefore be used to bring about, after any annealing at a temperature below or equal to 400° C., a significant degree of crystallinity without however damaging the electrodes or magnetic films located on either side of said tunnel barrier, particularly at the interfaces, or by electro-migration, or by the formation of metal bridges (pinholes) through the barrier.

In this way, this method proves particularly compatible when metal electrodes are used, made to advantage in a CoFeB or CoFe alloy, the structural and electronic transport properties of which improve when they are re-crystallized at temperatures of between 260 and 360° C. depending on the Boron content.

Furthermore, in the context of the implementation of a manganese alloy based antiferromagnetic film, intended to lock the magnetization of one of the magnetic films in question, it becomes highly advantageous to be able to limit to less than 350° C. the temperature of the anneal intended to crystallize the strontium titanate film constituting the tunnel barrier. Indeed, this restricts the migration of the manganese in the tunnel barrier the consequence of which would be to significantly degrade the tunnel transport properties.

In addition, when the magnetic electrodes located on either side of the tunnel barrier, and typically made of CoFeB, are also produced by ion beam sputtering deposition (IBS), they come in the amorphous form. During the annealing phase, said magnetic CoFeB films are re-crystallized, causing a segregation of the doping boron allowing a significant increase in the TMR rate, constituting one of the intended aims of this invention.

According to the invention, the two magnetic films located on either side of the tunnel barrier may also be deposited by ion beam sputtering without breaking the vacuum. In this configuration, the first magnetic film is deposited on a growth film, itself deposited on a substrate.

The invention also relates to a magnetic tunnel junction comprising a film made of a dielectric material capable of constituting a tunnel barrier, interposed between two conducting magnetic films, and respectively:
  a reference magnetic film, known as the "locked film", with magnetization of fixed direction comprising at least one film made of a ferromagnetic material with film magnetization in-plane, coupled magnetically with a locking film made of an antiferromagnetic material;

a magnetic storage film, known as a "free film", with a variable direction of magnetization, comprising at least one film made of a ferromagnetic material with film magnetization in-plane.

According to the invention, the material constituting the tunnel barrier consists of an at least partially crystalline perovskite.

To advantage, the perovskite is polycristalline.

The invention further relates to a magnetic tunnel junction comprising a film made of a dielectric material capable of constituting a tunnel barrier, interposed between two conducting magnetic films, and respectively:

a reference magnetic film, known as a "locked film", with magnetization of fixed direction comprising at least one film made of a ferromagnetic material with film magnetization out-of-plane, coupled magnetically with a locking film made of an antiferromagnetic material;

a magnetic storage film, known as a "free film", with a variable direction of magnetization, comprising at least one film made of a ferromagnetic material with magnetization of the film out-of-plane;

and wherein the material constituting the tunnel barrier consists of an at least partially crystalline perovskite.

Here too, the perovskite is to advantage polycristalline.

According to the invention, the perovskite is selected to advantage from the group that includes strontium titanate ($SrTiO_3$), $BaTiO_3$, and more generally compounds of formula $[Ba_{1-x}Sr_x]TiO_3$ with x between 0 and 1, SBT ($SrBi_2Ta_2O_9$) and SBN ($SrBi_2Nb_2O_9$).

With the magnetic tunnel junction thus obtained, the RA product of the tunnel barrier is below 1 $\Omega \cdot \mu m^2$ and the TMR is above 200%.

The invention relates finally to magnetic random access memories, radio-frequency oscillators, magneto-resistive sensors and computer hard disk read heads that include such a magnetic tunnel junction.

BRIEF DESCRIPTION OF THE DRAWINGS

The manner in which the invention may be implemented and the resulting advantages will become clearer from the following embodiment example, given for information purposes and non-restrictively, supported by the appended figures among which.

DETAILED DESCRIPTION OF THE INVENTION

Figure 1:
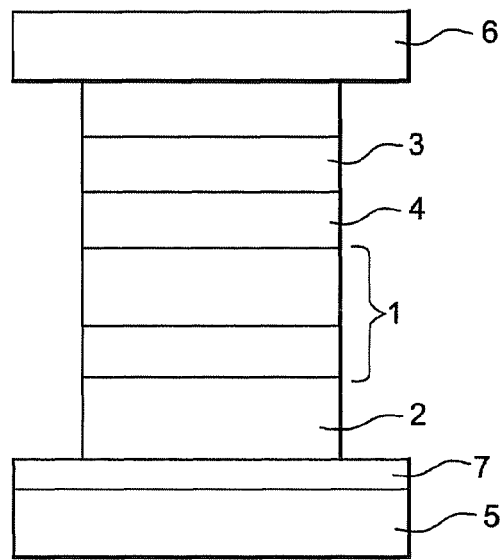
FIG. 1 shows the implementation of the tunnel junction with crystalline $SrTiO_3$ barrier in the context of a magnetic memory in accordance with the invention.

FIG. 1 therefore shows a magnetic stack obtained in accordance with the invention, and more specifically intended to constitute a memory point or cell of a magnetic random access memory (MRAM).

Conventionally, this comprises a locked film 1, in the case in point comprising a film made of a CoFeB alloy 2 nanometres thick, and a film of CoFe 2 nanometres thick. This locked film is coupled magnetically with a film 2 with antiferromagnetic properties, and in the case in point made of an IrMn alloy 6-7 nanometres thick.

This locked film is separated from a free film 3, also made of CoFeB alloy, and in the case in point ~3 nanometres thick, by the tunnel barrier 4 made of perovskite, and for example of strontium titanate $SrTiO_3$, with a thickness of less than 1.5 nanometres. Alternatively, the material may be barium titanate or Strontium and Barium titanate (SBT ($SrBi_2Ta_2O_9$), SBN ($SrBi_2Nb_2O_9$)), these different materials having a simple or double Perovskite structure.

On either side of these stacks are placed the traditional films, and in particular the upper and lower electrodes 5 and 6, supplying the electric write and read current from the memory point under consideration, and separated from the aforementioned stack respectively by spacers 7 of Ru or Ta for example, which act as growth films (underneath) and a protection film (above). The current leads may be made of Cu, Au, or AlSi.

Figure 2:
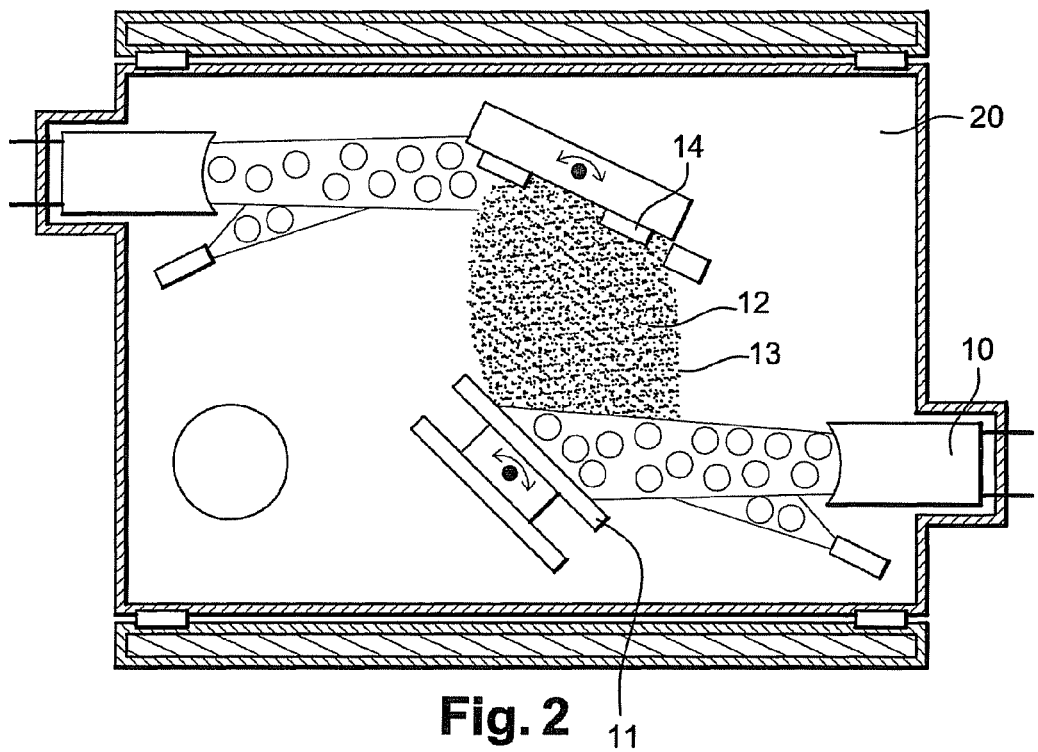
FIG. 2 is a diagrammatic representation showing the ion beam sputtering principle.

According to the invention, at least the film constituting the tunnel barrier 4 is made by ion beam sputtering—IBS, and the principle thereof is shown in FIG. 2.

The stack is produced on a substrate (of silicon for example) by a sequence of depositions of each material (1, 2, 3 and 4+growth film and protective film) starting from corresponding targets in the order described in FIG. 1 and starting from the bottom. It is advantageous to carry out the complete sequence in the same (IBS) facility without breaking the vacuum.

Ion beam sputtering is a physical vapour phase deposition technique according to which, in a vacuum enclosure 20, ions are produced by a source 10 and are accelerated towards a material for sputtering 11. According to this technique, the ion source 10 generates a beam of positive monoenergetic ions (with energy typically of between 500 and 1500 eV), the beam being defined spatially. The ion beam, usually $Ar^+$ ions, bombards a target 11 comprising in the case in point strontium titanate in order to obtain a strontium titanate barrier. The particles 12 so sputtered by the ion beam are emitted into the half-space 13 facing the target and are condensed on a surface 14 that may or may not be heated so as to faun a film of the material constituting the target.

The sputtered species resulting from this bombardment are then emitted into the half-space 13 facing the target, and are condensed on the film of CoFeB already deposited on the substrate, thereby forming a thin film. The absence of plasma in the environment of the films allows growth with few flaws and guarantees very high interface qualities, particularly appreciated in the context of controlling the properties of the materials used in the stacks of a plurality of films of nanometric thicknesses.

The substrate is also subjected to another low energetic oxygen beam from an assistance source, and typically of between 50 and 100 eV, increasing the compactness of the films of $SrTiO_3$ (or BaTiO3 or SBT), but also allowing its stoichiometry to be controlled.

The pumping of the sputtering chamber is of the cryogenic type. The vacuum is of the order of $2. 10^{-8}$ torr.

According to the invention, the magnetic films 1 and 3 respectively, and the antiferromagnetic film 2, may also be obtained by ion beam sputtering (as may the growth and protective films).

The IBS depositions are implemented to advantage at room temperature.

The tunnel junction resulting from this method may then be subjected to an annealing phase, involving in particular the magnetic films 1, 2 and 3, as well as the tunnel barrier 4, and typically at a temperature below 400° C. for example for 1 hour. A magnetic field may be applied while annealing in order to induce the orientation of the magnetization of the locked film 1+2. Owing to this anneal phase, a significant degree of crystallinity is conferred upon the tunnel barrier 4 without however damaging the adjacent magnetic films, free film 3, locked film 1 and antiferromagnetic film 2 respectively.

As regards the materials forming constituent parts of the free and locked films, other materials are possible. CoFe with different compositions may replace CoFeB if it is not necessary to have an amorphous electrode during deposition. NiFe20 may also be used in the free film in association with CoFeB or CoFe. The free and locked films may also comprise synthetic antiferromagnetic stacks of the Ferro/NM/Ferro type where the ferro materials are the aforementioned materials and NM is generally Ru but may also be Rh. Lastly electrodes with perpendicular magnetization (such as FePt, TbFeCo or (Co/Pt) multi-layers are conceivable).

Quite clearly, the invention also relates to the magnetic tunnel junction obtained by this method and the magnetic random access memories, radio-frequency oscillators, sensors, and read heads.

The invention claimed is:

1. A method for producing a magnetic tunnel junction, wherein a film of a dielectric material configured to act as a tunnel barrier is deposited between two nanocrystalline or amorphous magnetic films,
    wherein the film of dielectric material and the two magnetic films are stacked between two electrodes for supplying electric current,
    wherein the two magnetic films are metallic,
    wherein the dielectric material constituting the tunnel barrier consists of an at least partially crystalline perovskite, and
    wherein said material is deposited by ion beam sputtering in a vacuum chamber.

2. The method for producing a magnetic tunnel junction as claimed in claim 1, wherein the two magnetic films are produced on the basis of CoFeB or CoFe alloy.

3. The method for producing a magnetic tunnel junction as claimed in claim 1, wherein the perovskite is polycrystalline.

4. The method for producing a magnetic tunnel junction as claimed in claim 1, wherein the dielectric material is selected from the group including strontium titanate ($SrTiO_3$), $BaTiO_3$, SBT ($SrBi_2Ta_2O_9$) and SBN ($SrBi_2Nb_2O_9$).

5. The method for producing a magnetic tunnel junction as claimed in claim 1, wherein the dielectric material is deposited at room temperature.

6. The method for producing a magnetic tunnel junction as claimed in claim 1, wherein after the deposition of the second magnetic film on the tunnel barrier, the junction sustains an annealing treatment at a temperature equal at most to 400° C.

7. The method for producing a magnetic tunnel junction as claimed in claim 1, wherein the two magnetic films located on either side of the tunnel barrier are also deposited by ion beam sputtering without breaking the vacuum.

8. The method for producing a magnetic tunnel junction as claimed in claim 7, wherein the first magnetic film is deposited on a growth film, itself deposited on a substrate.

* * * * *